(12) United States Patent
Braganca et al.

(10) Patent No.: US 8,902,544 B2
(45) Date of Patent: Dec. 2, 2014

(54) SPIN TORQUE OSCILLATOR (STO) READER WITH SOFT MAGNETIC SIDE SHIELDS

(71) Applicant: HGST Netherlands B.V., Amsterdam (NL)

(72) Inventors: Patrick M. Braganca, San Jose, CA (US); Bruce A. Gurney, San Jose, CA (US); Yang Li, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/714,322

(22) Filed: Dec. 13, 2012

(65) Prior Publication Data

US 2014/0168812 A1   Jun. 19, 2014

(51) Int. Cl.
| | | |
|---|---|---|
| *G11B 5/127* | (2006.01) | |
| *G11B 5/33* | (2006.01) | |
| *H01F 10/32* | (2006.01) | |
| *G01R 33/00* | (2006.01) | |
| G11B 5/00 | (2006.01) | |
| G11B 5/39 | (2006.01) | |

(52) U.S. Cl.
CPC ............. *G01R 33/00* (2013.01); *H01F 10/32* (2013.01); *G11B 5/332* (2013.01); *G11B 2005/0005* (2013.01); *G11B 2005/3996* (2013.01)
USPC ..................................... 360/125.3; 360/327.1

(58) Field of Classification Search
USPC ............... 360/125.3, 125.31, 125.71, 125.74, 360/128, 319, 327.1–327.33
See application file for complete search history.

(56) References Cited

U.S. PATENT DOCUMENTS

| | | | |
|---|---|---|---|
| 7,869,165 B2 | 1/2011 | Miyauchi et al. | |
| 8,164,861 B2 | 4/2012 | Braganca et al. | |
| 8,194,361 B2 | 6/2012 | Kudo et al. | |
| 8,259,409 B2 | 9/2012 | Braganca et al. | |
| 8,320,080 B1 | 11/2012 | Braganca et al. | |
| 8,576,518 B1 * | 11/2013 | Zeltser et al. | 360/319 |
| 2003/0174446 A1 * | 9/2003 | Hasegawa | 360/319 |
| 2005/0146813 A1 * | 7/2005 | Oshima | 360/324.12 |
| 2006/0221515 A1 * | 10/2006 | Carey et al. | 360/324.12 |
| 2006/0256482 A1 * | 11/2006 | Araki et al. | 360/319 |
| 2007/0195467 A1 * | 8/2007 | Gill | 360/319 |
| 2009/0059423 A1 * | 3/2009 | Yamada et al. | 360/122 |
| 2010/0027168 A1 * | 2/2010 | Chou et al. | 360/319 |
| 2010/0033881 A1 | 2/2010 | Carey et al. | |
| 2010/0079917 A1 * | 4/2010 | Miyauchi et al. | 360/319 |
| 2010/0097729 A1 * | 4/2010 | Gill et al. | 360/324 |

(Continued)

OTHER PUBLICATIONS

U.S. Appl. No. 13/228,429, filed Sep. 8, 2011.

(Continued)

*Primary Examiner* — Adam B Dravininkas
(74) *Attorney, Agent, or Firm* — Zilka-Kotab, PC

(57) ABSTRACT

In one embodiment, a magnetic head includes a first shield; a spin torque oscillator (STO) sensor positioned above the first shield, the STO sensor comprising a reference layer and a free layer positioned above the reference layer; and at least one shield positioned in a plane that is parallel with a media-facing surface of the STO sensor, the plane also intersecting the STO sensor, wherein one or more of the at least one shield comprises a highly magnetically permeable material that is exchange decoupled and electrically decoupled from the STO sensor. Other magnetic heads, systems, and methods for producing the magnetic heads are described according to more embodiments.

24 Claims, 13 Drawing Sheets

(56) References Cited

U.S. PATENT DOCUMENTS

| | | |
|---|---|---|
| 2010/0328799 A1 | 12/2010 | Braganca et al. |
| 2011/0007426 A1 | 1/2011 | Qiu et al. |
| 2011/0007431 A1 | 1/2011 | Braganca et al. |
| 2011/0069417 A1* | 3/2011 | Kawamori et al. ............ 360/319 |
| 2011/0134572 A1* | 6/2011 | Qiu et al. ...................... 360/313 |
| 2011/0279923 A1* | 11/2011 | Miyauchi et al. ............... 360/75 |
| 2011/0317313 A1* | 12/2011 | Miyauchi et al. .......... 360/245.3 |
| 2012/0075752 A1 | 3/2012 | Sato et al. |
| 2012/0307404 A1* | 12/2012 | Braganca et al. .......... 360/245.8 |

OTHER PUBLICATIONS

Braganca et al., "Nanoscale magnetic field detection using a spin torque oscillator," 2010 Nanotechnology, vol. 21, abstract only.

* cited by examiner

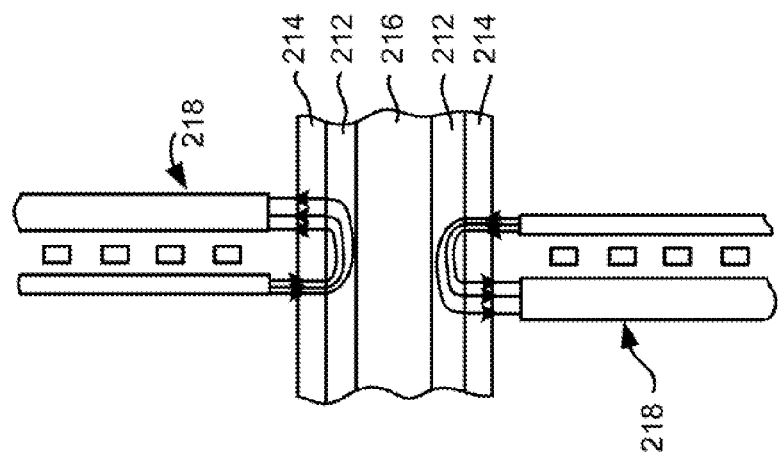
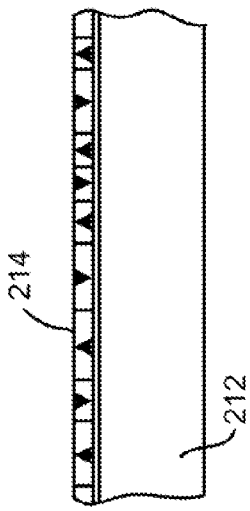
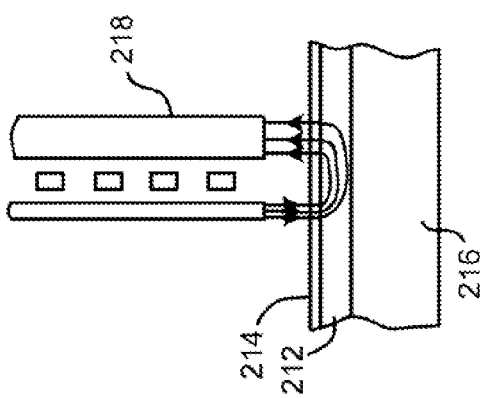
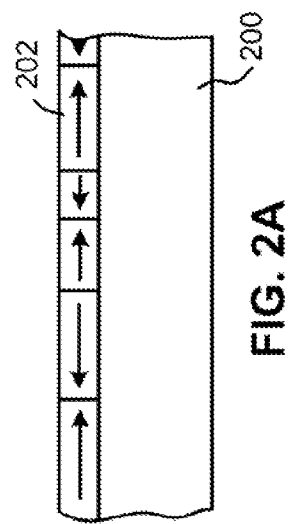
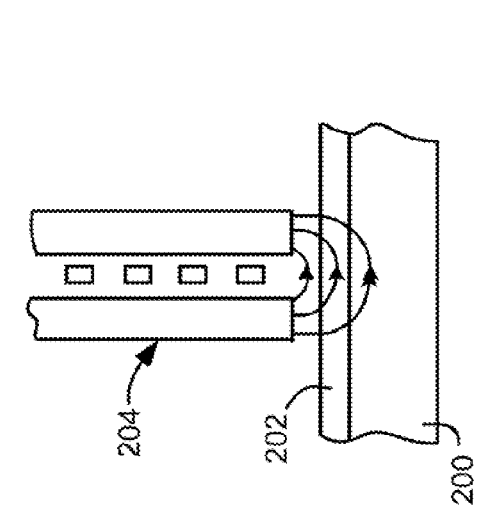

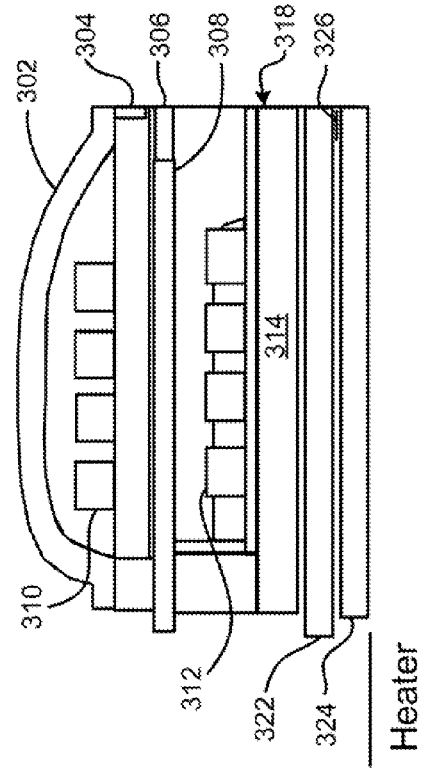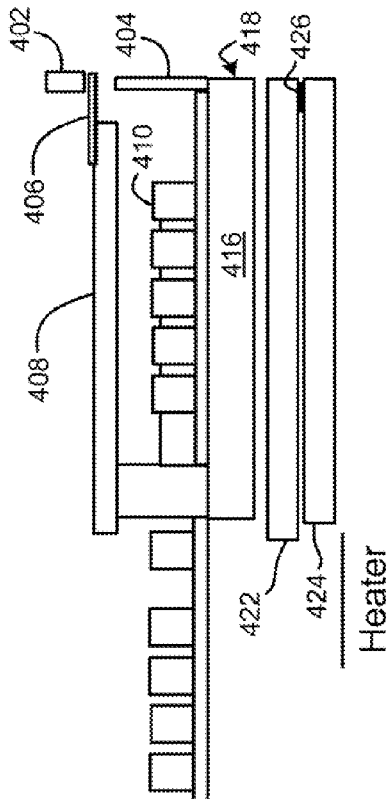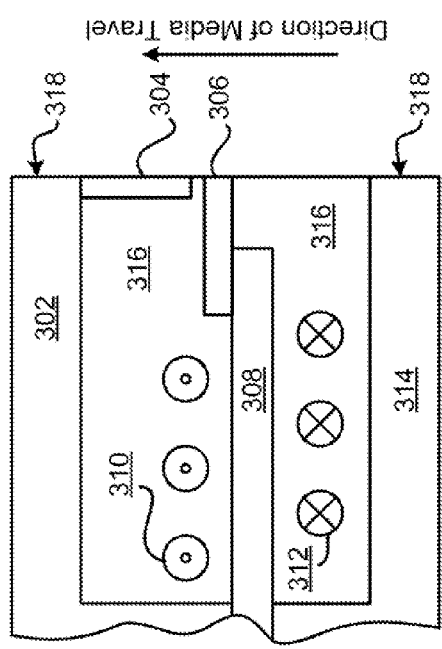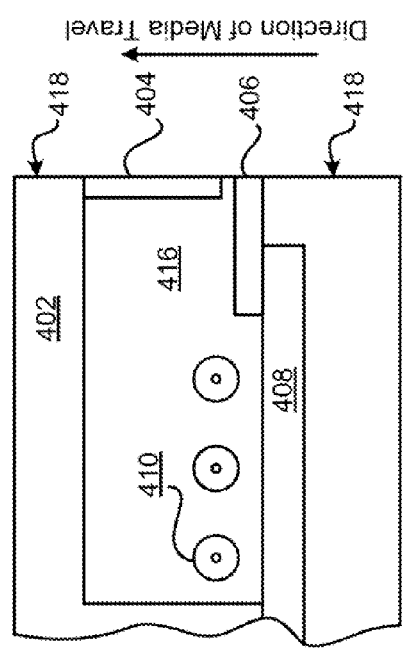
FIG. 3B
FIG. 4B
FIG. 3A
FIG. 4A

SPIN TORQUE OSCILLATOR (STO) READER WITH SOFT MAGNETIC SIDE SHIELDS

FIELD OF THE INVENTION

The present invention relates to data storage systems, and more particularly, this invention relates to a spin torque oscillator (STO) reader with soft magnetic side shields for use in magnetic heads.

BACKGROUND

The heart of a computer is a magnetic hard disk drive (HDD) which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

The volume of information processing in the information age is increasing rapidly. In particular, HDDs have been desired to store more information in its limited area and volume. A technical approach to this desire is to increase the capacity by increasing the recording density of the HDD. To achieve higher recording density, further miniaturization of recording bits is effective, which in turn typically requires the design of smaller and smaller components.

The further miniaturization of the various components, however, presents its own set of challenges and obstacles. As HDD areal density increases, the dimensions of both bits and the readback sensor must become smaller and smaller. However, requirements for media overcoats and lube have made it difficult to scale down the slider fly height in proportion to the reduction in reader dimensions, creating a discrepancy between the physical reader track width and an effective "magnetic read width" because of the interaction between stray magnetic flux from tracks adjacent to the written track and the read head.

One proposed solution to solve this problem is to deposit high permeability material on the sides of the read head to act as side shields to absorb the stray flux from adjacent tracks and bring the magnetic read width more in line with the physical track width, which may help reduce some of the constraints in fabricating the heads as well as help overall signal-to-noise ratio (SNR) by allowing for a larger physical track width (e.g., larger free layer magnetic volume would reduce magnetic noise in a read device).

One issue with implementing this strategy is that the side shields would replace the traditional hard bias material in the read head, which is required for standard sensor operation. The shield material may double as a hard bias source, but materials with good shield characteristics tend to have lower coercivity and anisotropy, and less available magnetic field for sensor stabilization. Another option is to put the hard bias on a back edge of the read sensor, but this too would decrease the available field for stabilization as the hard bias would be located away from the plane of the sensor.

Accordingly, one solution is to use a read sensor that does not require hard bias in the conventional location (i.e., adjacent to the sensor edges which define the track width). One such sensor is called a scissor sensor, and includes two free magnetic layers that are oriented at about 45° with respect to one another by placing the hard bias at the back edge of the sensor and orienting the hard bias in a transverse direction (as opposed to a longitudinal direction as for conventional sensors). This allows for the fabrication of side shields without affecting sensor performance (see, for example, U.S. Pat. No. 7,869,165 and U.S. Patent Appl. Pub. No. 2011/0007426).

SUMMARY

In one embodiment, a magnetic head includes a first shield; a spin torque oscillator (STO) sensor positioned above the first shield, the STO sensor comprising a reference layer and a free layer positioned above the reference layer; and at least one shield positioned in a plane that is parallel with a media-facing surface of the STO sensor, the plane also intersecting the STO sensor, wherein one or more of the at least one shield comprises a highly magnetically permeable material that is exchange decoupled and electrically decoupled from the STO sensor.

In another embodiment, a method for forming a magnetic head includes forming a first shield; forming a STO sensor stack above the first shield, the STO sensor stack comprising a reference layer positioned below a free layer; and forming at least one shield in a plane that is parallel with a media-facing surface of the STO sensor stack, the plane also intersecting the STO sensor stack, wherein one or more of the at least one shield comprises a highly magnetically permeable material that is exchange decoupled and electrically decoupled from the STO sensor stack.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 2A.

FIG. 2C is a magnetic recording medium utilizing a perpendicular recording format.

FIG. 2D is a schematic representation of a recording head and recording medium combination for perpendicular recording on one side.

FIG. 2E is a schematic representation of a recording apparatus adapted for recording separately on both sides of the medium.

FIG. 3A is a cross-sectional view of one particular embodiment of a perpendicular magnetic head with helical coils.

FIG. 3B is a cross-sectional view of one particular embodiment of a piggyback magnetic head with helical coils.

FIG. 4A is a cross-sectional view of one particular embodiment of a perpendicular magnetic head with looped coils.

FIG. 4B is a cross-sectional view of one particular embodiment of a piggyback magnetic head with looped coils.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods, as well as operation and/or component parts thereof.

In one general embodiment, a magnetic head includes a first shield; a spin torque oscillator (STO) sensor positioned above the first shield, the STO sensor comprising a reference layer and a free layer positioned above the reference layer; and at least one shield positioned in a plane that is parallel with a media-facing surface of the STO sensor, the plane also intersecting the STO sensor, wherein one or more of the at least one shield comprises a highly magnetically permeable material that is exchange decoupled and electrically decoupled from the STO sensor.

In another general embodiment, a method for forming a magnetic head includes forming a first shield; forming a STO sensor stack above the first shield, the STO sensor stack comprising a reference layer positioned below a free layer; and forming at least one shield in a plane that is parallel with a media-facing surface of the STO sensor stack, the plane also intersecting the STO sensor stack, wherein one or more of the at least one shield comprises a highly magnetically permeable material that is exchange decoupled and electrically decoupled from the STO sensor stack.

Figure 1:
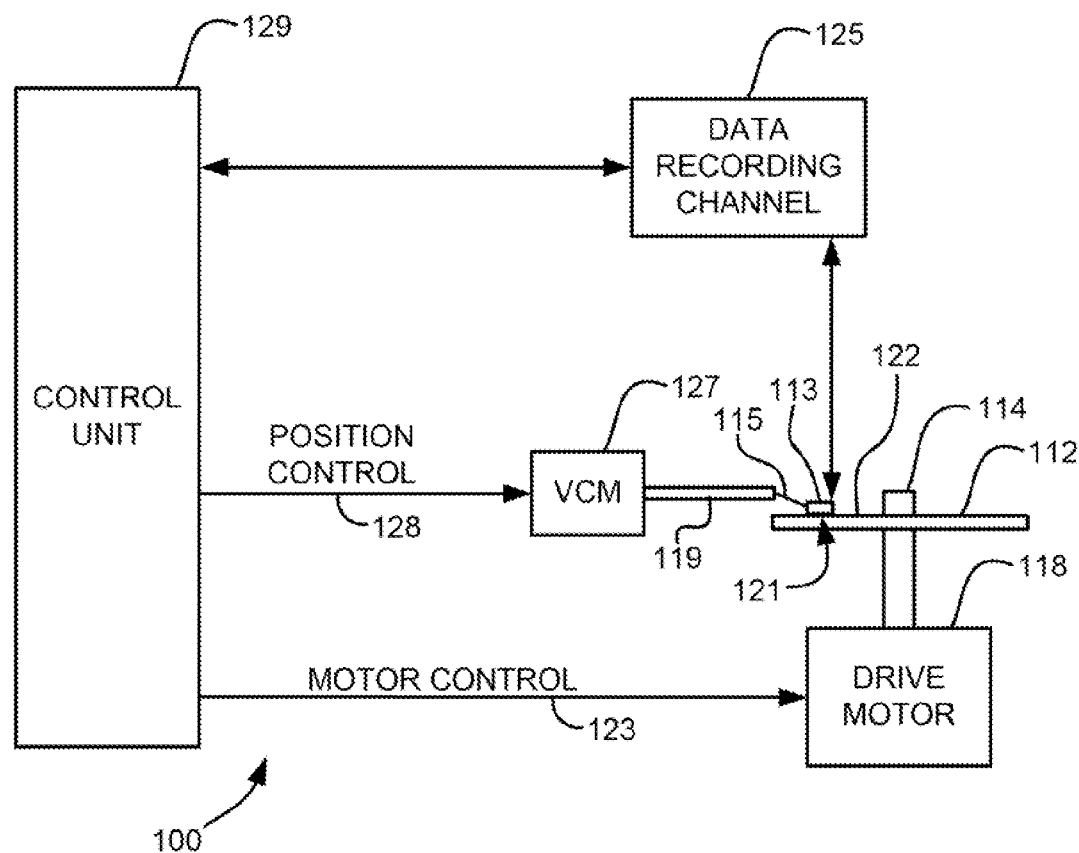
FIG. 1 is a simplified drawing of a magnetic recording disk drive system.

Referring now to FIG. 1, there is shown a disk drive 100 in accordance with one embodiment of the present invention. As shown in FIG. 1, at least one rotatable magnetic disk 112 is supported on a spindle 114 and rotated by a drive mechanism, which may include a disk drive motor 118. The magnetic recording on each disk is typically in the form of an annular pattern of concentric data tracks (not shown) on the disk 112.

At least one slider 113 is positioned near the disk 112, each slider 113 supporting one or more magnetic read/write heads 121. As the disk rotates, slider 113 is moved radially in and out over disk surface 122 so that heads 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by controller 129, such as access control signals and internal clock signals. Typically, control unit 129 comprises logic control circuits, storage (e.g., memory), and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write head includes a coil layer embedded in one or more insulation layers (insulation stack), the insulation stack being located between first and second pole piece layers. A gap is formed between the first and second pole piece layers by a gap layer at an air bearing surface (ABS) of the write head. The pole piece layers may be connected at a back gap. Currents are conducted through the coil layer, which produce magnetic fields in the pole pieces. The magnetic fields are channeled across the gap at the ABS for the purpose of writing bits of magnetic field information in tracks on moving media, such as in circular tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

FIG. 2A illustrates, schematically, a conventional recording medium such as used with magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a conventional recording/playback head 204, which may preferably be a thin film head, and a conventional recording medium, such as that of FIG. 2A.

FIG. 2C illustrates, schematically, the orientation of magnetic impulses substantially perpendicular to the surface of a recording medium as used with magnetic disc recording systems, such as that shown in FIG. 1. For such perpendicular recording the medium typically includes an under layer 212 of a material having a high magnetic permeability. This under layer 212 is then provided with an overlying coating 214 of magnetic material preferably having a high coercivity relative to the under layer 212.

FIG. 2D illustrates the operative relationship between a perpendicular head 218 and a recording medium. The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

In this structure, the magnetic lines of flux extending between the poles of the perpendicular head 218 loop into and out of the overlying coating 214 of the recording medium with the high permeability under layer 212 of the recording medium causing the lines of flux to pass through the overlying coating 214 in a direction generally perpendicular to the surface of the medium to record information in the overlying coating 214 of magnetic material preferably having a high coercivity relative to the under layer 212 in the form of magnetic impulses having their axes of magnetization substantially perpendicular to the surface of the medium. The flux is channeled by the soft underlying coating 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium, allowing for recording on each side of the medium.

FIG. 3A is a cross-sectional view of a perpendicular magnetic head. In FIG. 3A, helical coils 310 and 312 are used to create magnetic flux in the stitch pole 308, which then delivers that flux to the main pole 306. Coils 310 indicate coils extending out from the page, while coils 312 indicate coils extending into the page. Stitch pole 308 may be recessed from the ABS 318. Insulation 316 surrounds the coils and may provide support for some of the elements. The direction of the media travel, as indicated by the arrow to the right of the structure, moves the media past the lower return pole 314 first, then past the stitch pole 308, main pole 306, trailing shield 304 which may be connected to the wrap around shield (not shown), and finally past the upper return pole 302. Each of these components may have a portion in contact with the ABS 318. The ABS 318 is indicated across the right side of the structure.

Perpendicular writing is achieved by forcing flux through the stitch pole 308 into the main pole 306 and then to the surface of the disk positioned towards the ABS 318.

FIG. 3B illustrates a piggyback magnetic head having similar features to the head of FIG. 3A. Two shields 304, 314 flank the stitch pole 308 and main pole 306. Also sensor shields 322, 324 are shown. The sensor 326 is typically positioned between the sensor shields 322, 324.

FIG. 4A is a schematic diagram of one embodiment which uses looped coils 410, sometimes referred to as a pancake configuration, to provide flux to the stitch pole 408. The stitch pole then provides this flux to the main pole 406. In this orientation, the lower return pole is optional. Insulation 416 surrounds the coils 410, and may provide support for the stitch pole 408 and main pole 406. The stitch pole may be recessed from the ABS 418. The direction of the media travel, as indicated by the arrow to the right of the structure, moves the media past the stitch pole 408, main pole 406, trailing shield 404 which may be connected to the wrap around shield (not shown), and finally past the upper return pole 402 (all of which may or may not have a portion in contact with the ABS 418). The ABS 418 is indicated across the right side of the structure. The trailing shield 404 may be in contact with the main pole 406 in some embodiments.

FIG. 4B illustrates another type of piggyback magnetic head having similar features to the head of FIG. 4A including a looped coil 410, which wraps around to form a pancake coil. Also, sensor shields 422, 424 are shown. The sensor 426 is typically positioned between the sensor shields 422, 424.

In FIGS. 3B and 4B, an optional heater is shown near the non-ABS side of the magnetic head. A heater (Heater) may also be included in the magnetic heads shown in FIGS. 3A and 4A. The position of this heater may vary based on design parameters such as where the protrusion is desired, coefficients of thermal expansion of the surrounding layers, etc.

Examples of conventional spin torque oscillator (STO) sensors are described in U.S. Pat. No. 8,259,409 and U.S. Patent Appl. Pub. No. 2011/0007431, which are herein incorporated by reference, and in P. Braganca, et al., "Nanoscale Magnetic Field Detection Using a Spin Torque Oscillator," Nanotechnology 21 235202 (2010). The STO may be either an all metallic spin valve structure or a magnetic tunnel junction (MTJ) having an insulating tunnel barrier sandwiched between two ferromagnetic electrodes. Several options have been proposed for an STO sensor stack.

Figure 5:
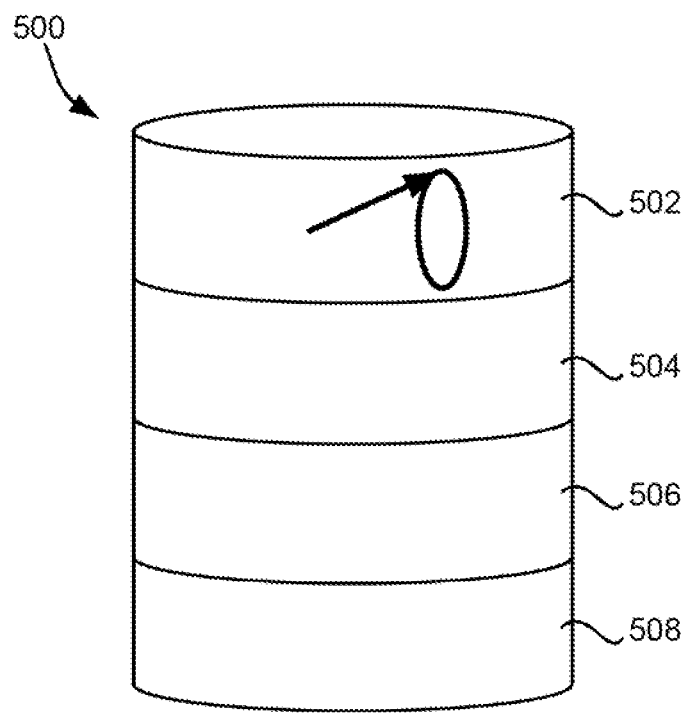
FIG. 5 shows a conventional spin torque oscillator (STO) sensor.

In one such conventional STO sensor 500, as shown in FIG. 5, a free layer 502 and reference layer 506 are separated by a spacer layer 504 with suitable cap layer(s) above and underlayer(s) below (not shown), as known in the art. The reference layer 506 is positioned above an antiferromagnetic (AFM) layer 508. This STO sensor 500 may include a simple pinned reference layer 506 or an antiparallel (AP)-pinned reference layer having two ferromagnets coupled by a thin interlayer (such as a Ru spacer).

Figure 6:
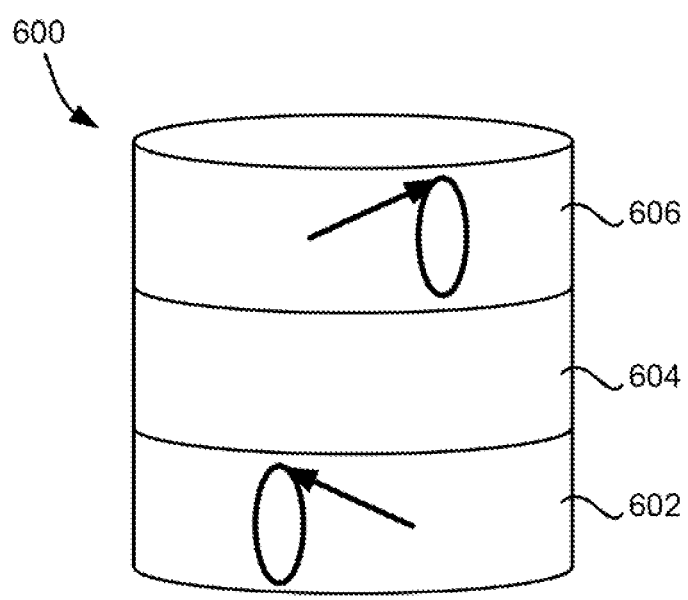
FIG. 6 shows a synthetic antiferromagnetic (SAF) STO sensor.

According to another example, as shown in FIG. 6, a synthetic antiferromagnetic (SAF) STO sensor 600 may include two unpinned ferromagnetic layers 602, 606 that are free to oscillate freely, separated by a spacer layer 604 with suitable cap layer(s) above and underlayer(s) below, as known in the art. An example of this type of STO sensor is provided in U.S. Pat. No. 8,164,861, which is herein incorporated by reference. Magnetic moments of the ferromagnetic layers 602, 606 are oriented antiparallel (AP) to one another, such as by using some combination of interlayer coupling and/or dipole field coupling.

Figure 7:
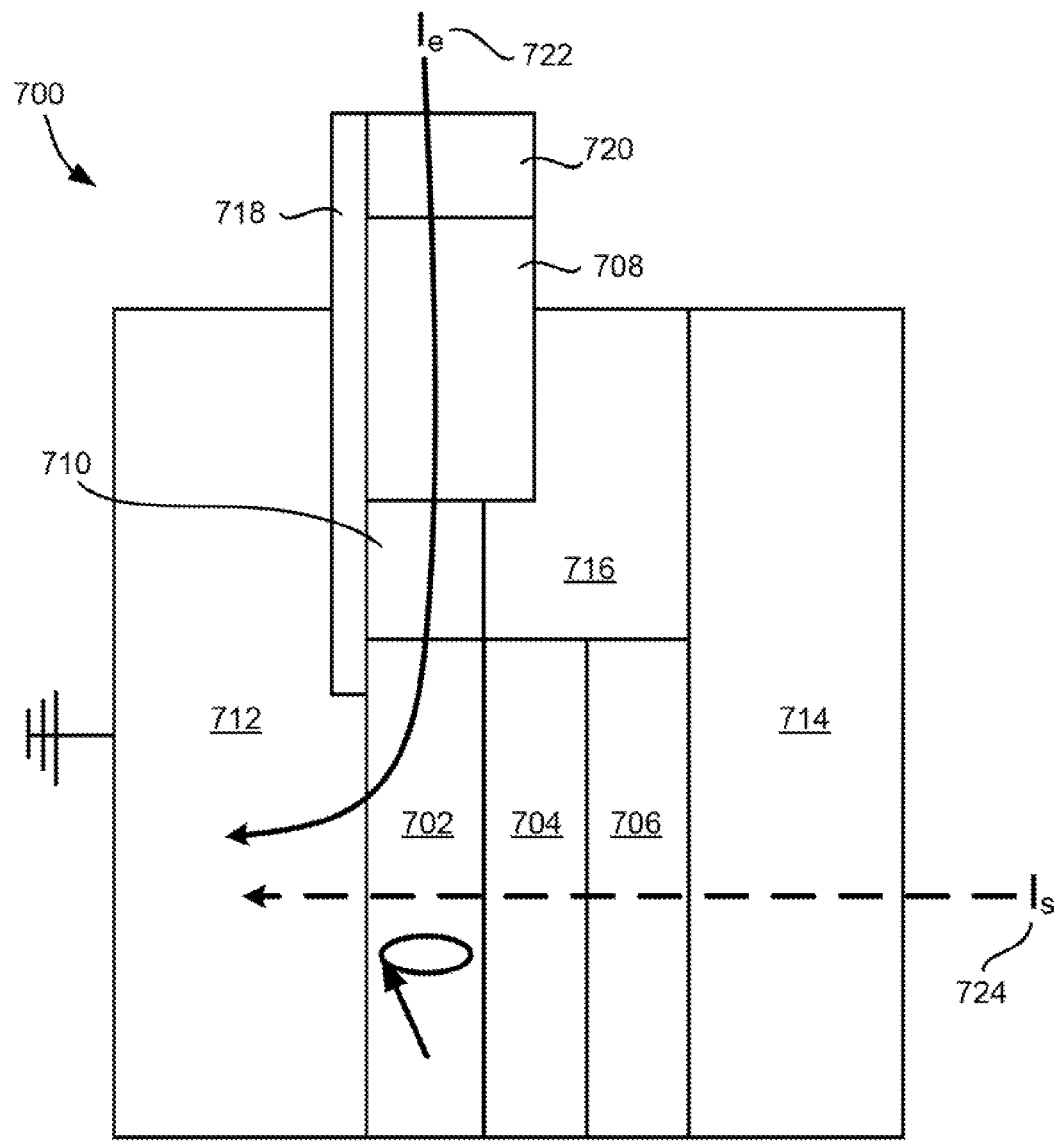
FIG. 7 shows a transition mode three terminal STO sensor structure, according to one embodiment.

Another suitable STO sensor orientation is shown in FIG. 7. Here, a transition mode three terminal STO sensor structure 700 is shown, with the STO sensor having a spin valve and MTJ sharing a common free ferromagnet layer 702. The three terminal STO sensor structure 700 includes shields 712 and 714 on either side of the stack, a tunnel barrier 704, a first reference layer 706, a metal conductor layer 710, a second reference layer 708, a contact 720, and insulators 716, 718. With this STO sensor structure 700, an excitation current ($I_e$) 722 for oscillations is decoupled from a sense current ($I_s$) 724 used for detection. By this decoupling, any negative aspects of each STO structure are minimized while maintaining an increased signal amplitude for overall detection and SNR of the system.

Examples of this type of STO sensor may be found in U.S. Pat. No. 8,320,080, issued Nov. 27, 2012, which is herein incorporated by reference.

Figure 8:
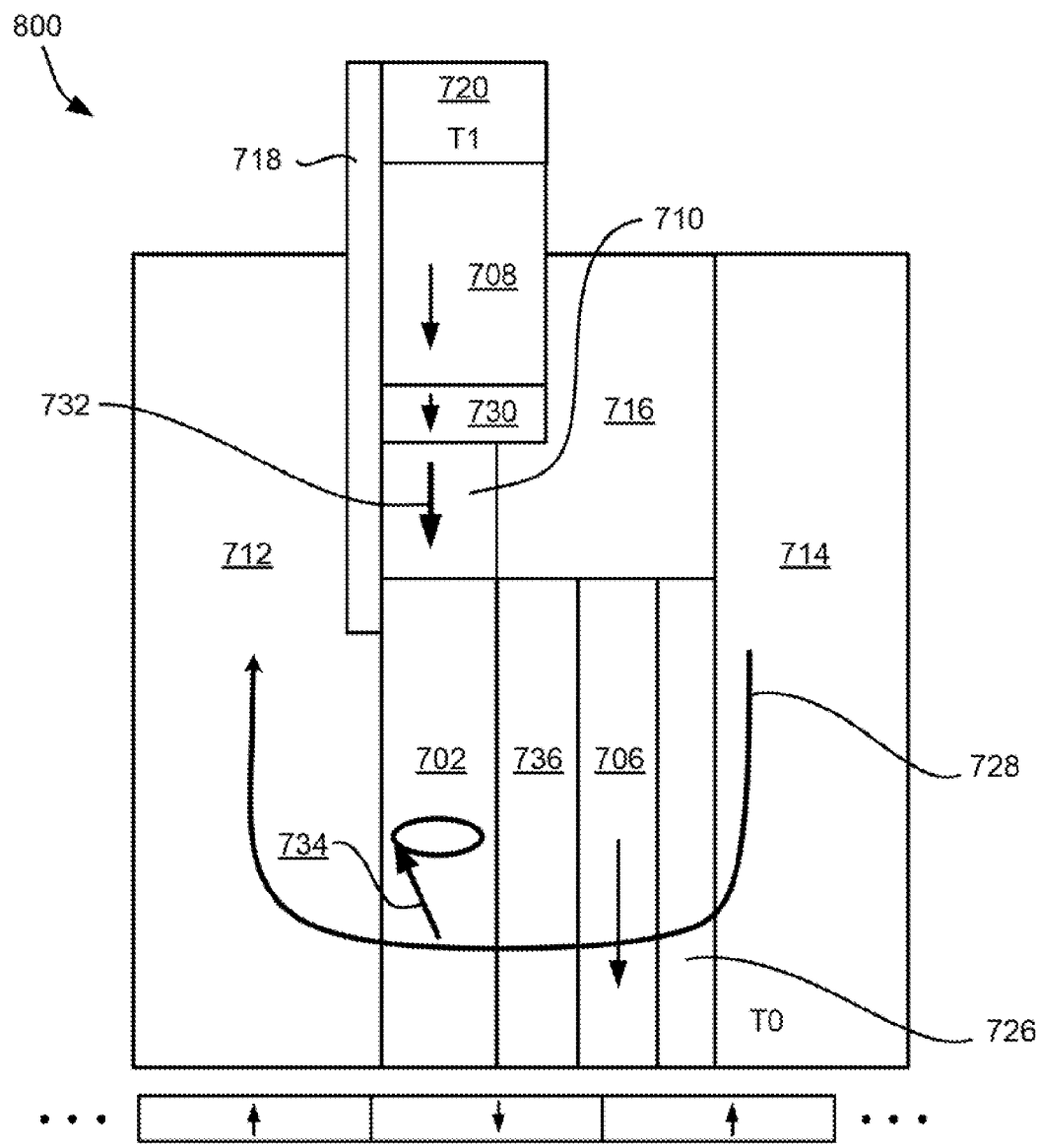
FIG. 8 shows a thermagnonic STO sensor structure, according to one embodiment.

Now referring to FIG. 8, an exemplary thermagnonic STO sensor structure 800 is shown. This sensor has a similar structure to the three-terminal structure 700 shown in FIG. 7, but as shown in FIG. 8, the thermagnonic STO sensor structure 800 replaces the spin current 734 generated using a spin polarized electric current 728 passing through the second reference layer 706 with a spin current 732 generated by a magnetic oxide 708. The thermagnonic STO sensor structure 800 also comprises a free ferromagnet layer 702, a spacer layer 736, a pinning structure 726, shields 712 and 714 (the latter at temperature TO), a metal conductor 710, a magnetic metal layer 730, a contact 720 at temperature TI, and insulators 716 and 718. An example of this type of sensor may be found in U.S. patent application Ser. No. 13/228,429, filed Sep. 8, 2011, which is herein incorporated by reference.

Unlike conventional tunneling magnetoresistance (TMR) and current-perpendicular-to-plane (CPP) giant magnetoresistance (GMR) sensors that operate by inducing an orthogonal configuration between a free layer and a reference layer, a preferred orientation for a STO sensor is to have the free layer and the reference layer (or in the case of the SAF-STO, the two free layers) approximately antiparallel (AP). This eliminates the need for a hard bias material on sides of the sensor and provides a more favorable position for the placement of the hard bias, specifically at a back edge of the sensor. Accordingly, in one approach, the conventionally located hard bias material—which is typically very hard magnetically—is replaced with a soft magnetic material which has high permeability (a highly magnetically permeable material), such as NiFe or other known soft magnetic materials having high permeability, to act as a magnetic shield.

Examples of other suitable materials for the soft magnetic material includes Ni, NiFe, Co, and their alloys; CoZr, CoTa, CoNb, CoFe, and their alloys, Ferrites such as Fe ferrite, Co Ferrite, Ni Ferrite, and their composites, and/or any other magnetically soft materials whose anisotropy field tHk satisfies the condition 5 Oe<Hk=Ms/K<500 Oe, where Ms is the saturation magnetization>0.1 emu/cc and K is the magnetic anisotropy energy density.

In this approach, any type of STO sensor or STO sensor variation, as described herein or others not specifically described but known in the art, may be used to form a STO read sensor in a magnetic head.

Figure 9A:
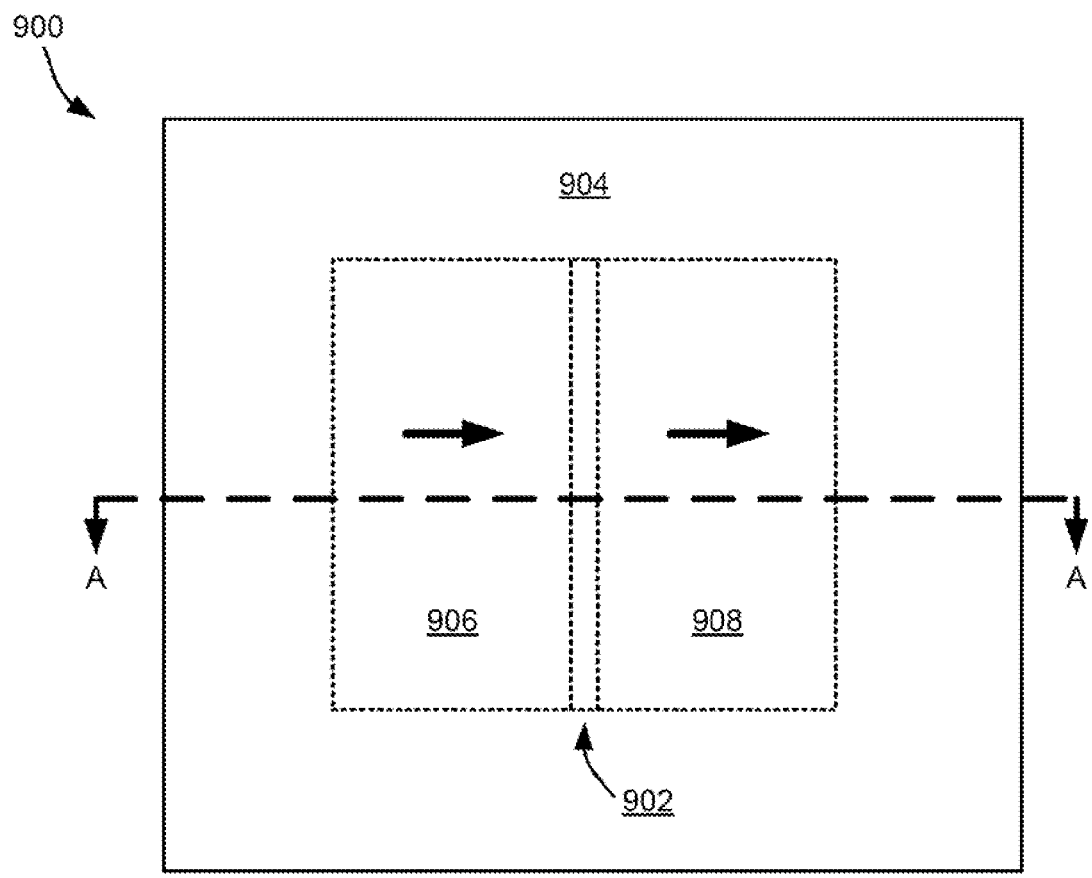
FIG. 9A shows a top view of a STO sensor structure according to one embodiment.
Figure 9B:
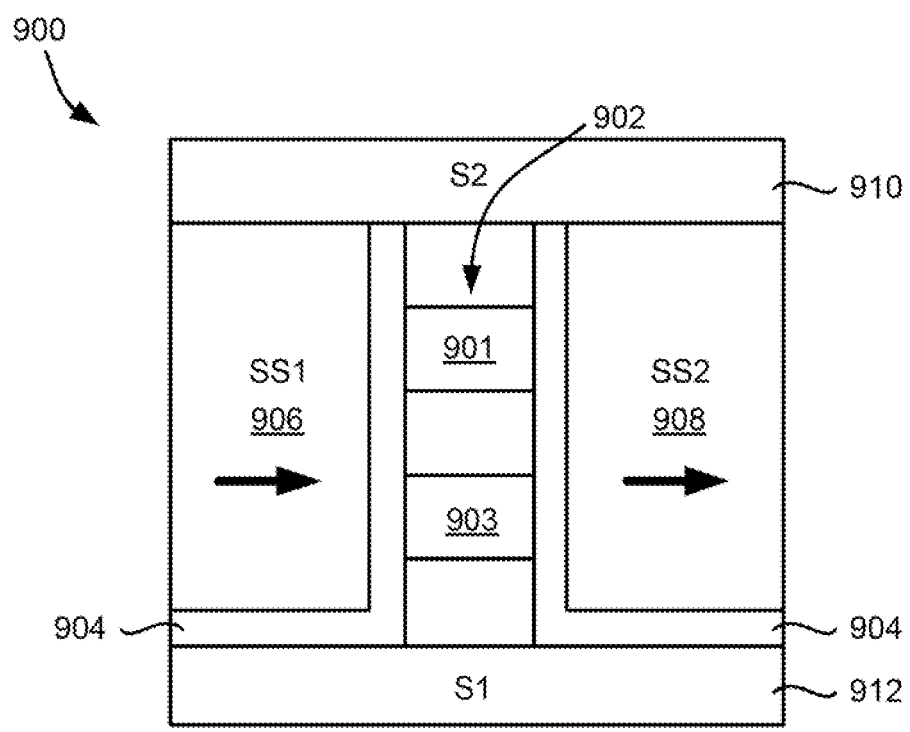
FIGS. 9B-9D shows various embodiments of the STO sensor structure taken from line A in FIG. 9A from a media-facing surface thereof.
Figure 9C:
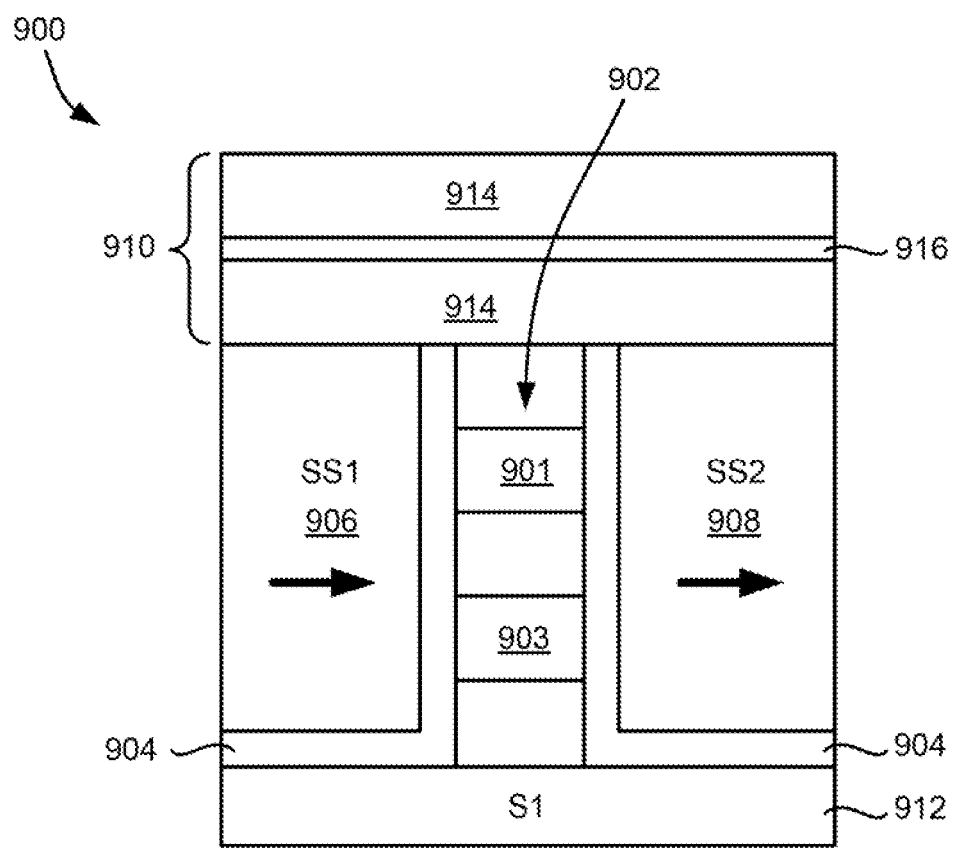
Figure 9D:
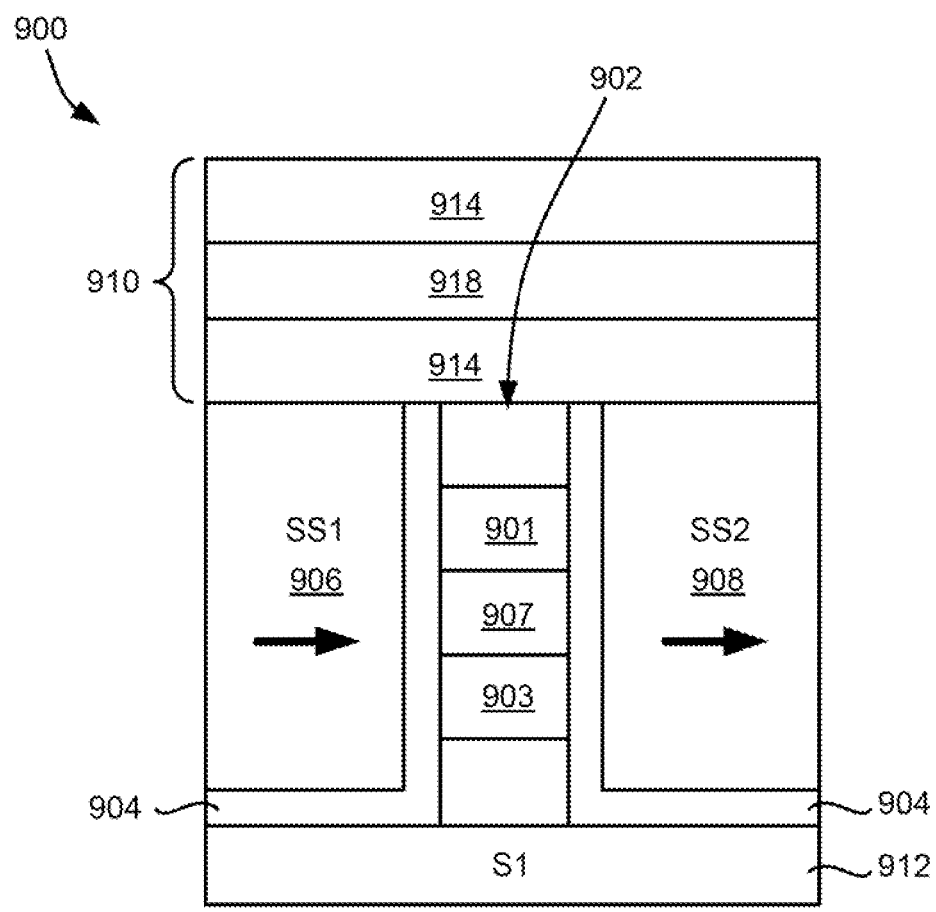

Now referring to FIGS. 9A-9D, a structure 900 comprising a STO sensor 902 and no hard bias is shown according to several embodiments. FIG. 9A shows a top view, while FIGS. 9B-9D show views taken from line A in FIG. 9A at a media-facing surface of the STO sensor structure 900. In one embodiment, to form the structure 900, the STO sensor 902 (sometimes referred to as a STO sensor stack or simply sensor stack) may be patterned via a conventional sensor formation process above a first shield (S1) 912, which may serve as a bottom electrode. The sensor stack 902 may include spacer layers, cap layers, and/or underlayers, as known in the art. The sensor stack 902 may then have a thin insulating material 904 such as SiN or alumina deposited on sides thereof, such as via atomic layer deposition (ALD), to insulate sidewalls of the STO sensor 902, along with the portions of the first shield 912 not covered by the sensor stack 902. Then, two side shields (SS1 906 and SS2 908) may be deposited above and adjacent the insulating material 904 on sides of the sensor stack 902 in a cross-track direction. As an option, a second shield (S2) 910, which may serve as a top electrode, may then be deposited such that it exchange couples to the side shields 906, 908.

Referring again to FIG. 9B, a single layer second shield 910 is shown which may be deposited as a single, thick layer. In FIG. 9C, a laminated second shield 910 is shown comprising two or more thin shield layers 914 separated by one or more coupling layers 916, which may comprise Ru or some other suitable material. The top shield layer may be a thick layer or a layer having a similar thickness to the other shield layers 914. The one or more shield layers 914 are antiferromagnetically coupled, which may improve stability. FIG. 9D shows a pinned second shield 910 comprising two or more shield layers 914 pinned using an antiferromagnet (AFM) layer 918. This structure may be laminated (have this structure repeated with multiple AFM layers 918 separating multiple shield layers 914). This may be done by first depositing a thinner shield layer 914, then the AFM layer 918, which may comprise IrMn, PtMn, or some other suitable material known in the art, and then a thicker shield layer 914 thereabove. A combination of lamination and pinning may also be used to help improve the shield stability.

In another approach, the side shields SS1 906 and SS2 908 may also be used to provide a small biasing field which may cant the magnetization of the free layer 901 of the STO sensor 902 slightly, e.g., <10°, from the direction of magnetization of the reference layer 903, which has been shown to improve STO performance. U.S. Patent Appl. Pub. No. 2011/0007431, which is herein incorporated by reference, provides more detail about the improvements.

In one embodiment, some or all of the shield layers (e.g., first shield 912, second shield 910, side shield SS1 906, and/or side shield SS2 908) may comprise the same material. In an alternate embodiment, the second shield 910 comprises a different material from the side shields 906, 908.

Figure 10A:
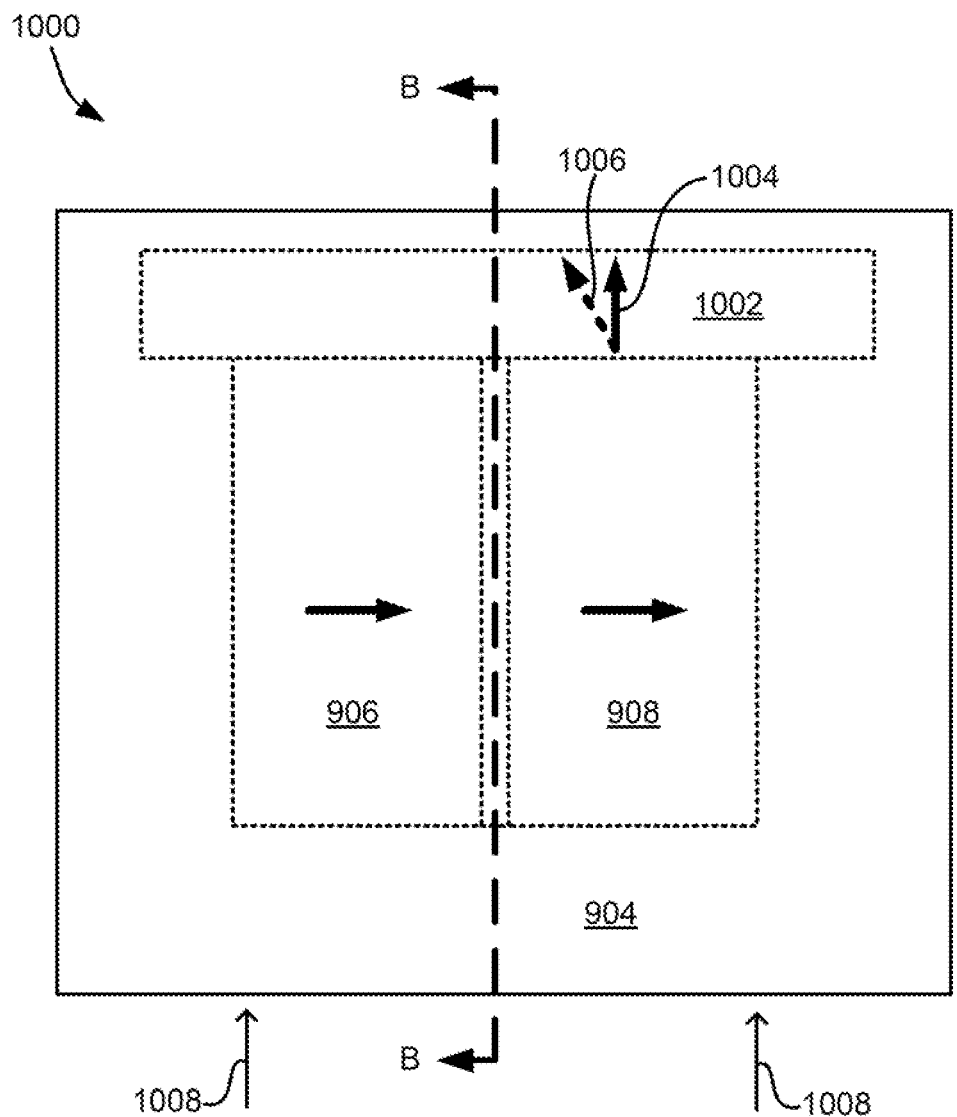
FIG. 10A shows a top view of a STO sensor structure according to one embodiment.
Figure 10B:
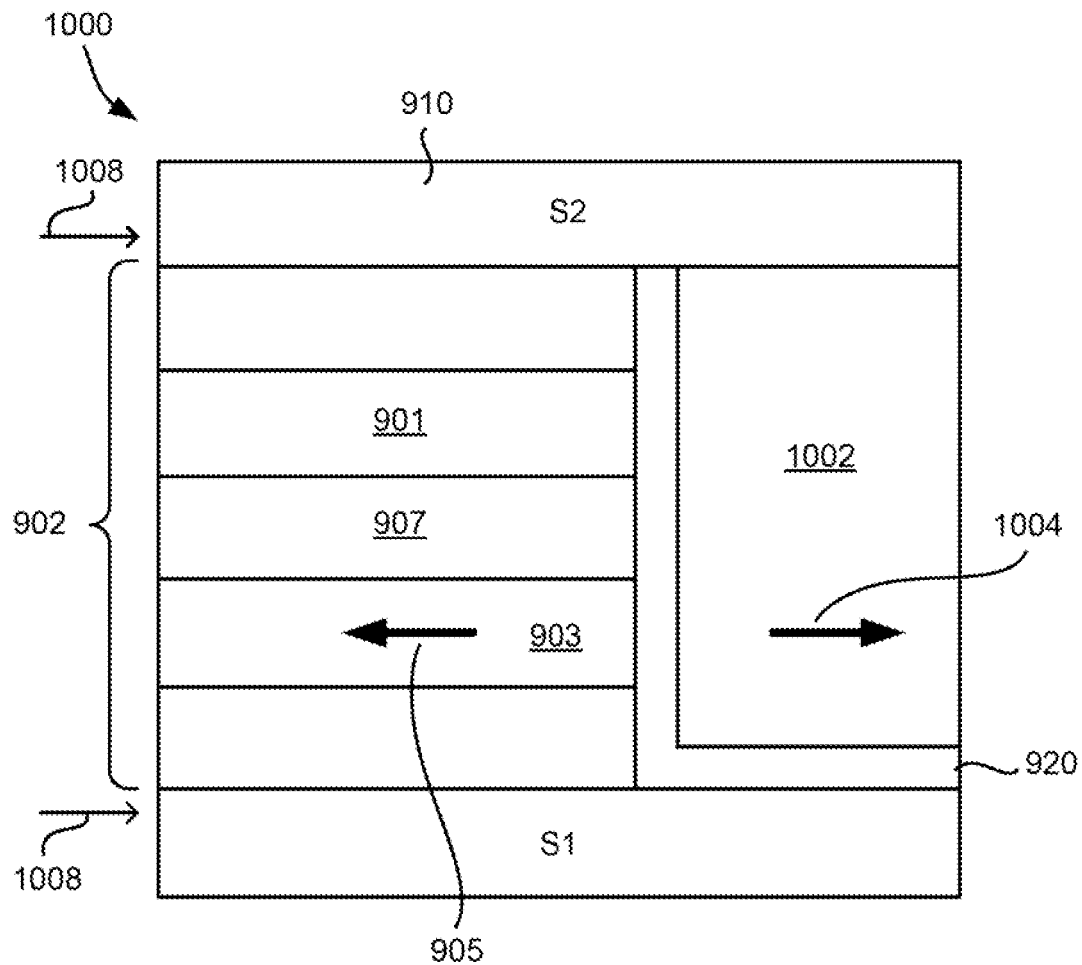
FIG. 10B shows the STO sensor structure taken from line B in FIG. 10A, according to one embodiment.

Now referring to FIGS. 10A-10B, a structure 1000 comprising a STO sensor 902 and a hard bias 1002 is shown according to one embodiment. FIG. 10A shows a top view, while FIG. 10B shows a view taken from line B in FIG. 10A The side shields 906, 908 may be patterned and/or formed as described in relation to FIGS. 9A-9D, but as shown in FIGS. 10A-10B, but additional steps may be performed after the sensor formation processing to deposit a hard bias material 1002 at a back edge of the STO sensor stack 902. The hard bias 1002 may be formed by milling the insulator 920 at the back edge, depositing a thin layer of alumina or SiN, such as via ALD, and then depositing the hard bias 1002.

In one embodiment, the hard bias 1002 may be magnetized in a direction 1004 parallel to the magnetization direction 905 of the reference layer 903 (e.g., a direction about parallel to the magnetization direction 905 of the reference layer 903, although not necessarily in the same direction), as it is desired to stabilize the free layer 901 in an antiparallel configuration with the reference layer 903. As shown in FIG. 10A, the magnetization direction 1004 points in a direction away from the sensor stack 902. However, in an alternate embodiment, the magnetization direction 1004 may point in a direction toward the sensor stack 902.

In another embodiment, the hard bias 1002 may be magnetized in a direction 1006 canted toward a direction transverse to the magnetization direction 905 of the reference layer 903 (e.g., a direction having two components, one component opposite to and one component transverse to the magnetization direction 905 of the reference layer 903). In this embodiment, the hard bias 1002 has magnetization that is slightly canted from antiparallel with the magnetization direction 905 of the reference layer 903 to cant the magnetization direction of the free layer 901 slightly away from the magnetization direction 905 of the reference layer 903. In this embodiment, or any other described herein, an STO spacer layer 907 may comprise a metal or metal alloy, e.g., it is a metallic layer, or the STO spacer layer 907 may comprise an insulating material that conducts some amount of electricity, as in a tunnel junction structure. In another embodiment, the STO spacer layer 907 may comprise an insulating layer having one or more metallic conducting channels therethrough.

This canted magnetization direction is not shown in FIG. 10B because the cant is in a plane extending into the figure. This has been shown to improve oscillator performance. For more detail on the improvements, see U.S. Patent Appl. Pub. No. 2011/0007431.

According to any of these embodiments described in FIGS. 9A-10B, a STO sensor 902 operating as a magnetic field sensor in a magnetic recording system may have several different stack structures, but in general the free layer 901 and reference layer 903 are oriented mostly antiparallel (AP) to one another through an appropriate combination of hard bias, dipole coupling, exchange bias, and/or anisotropy, as could be readily determined by one skilled in the art without undue experimentation, e.g., via modeling, upon being apprised of the present disclosure. Transitions in a magnetic media positioned near the free layer 901 results in fluctuations of a magnetic field biased across the STO sensor 902, changing a resonance frequency of the STO sensor 902, which is measurable using suitable electronics, logic, circuitry, etc. As this STO sensor 902 has an AP configuration of the magnetic layers, as opposed to a 90° orientation, hard bias located on sides of the sensor stack 902 may be omitted and replaced with a high magnetic permeability material, such as NiFe, to act as shields SS1 906 and SS2 908 on the sides of the sensor stack 902, so as to absorb flux from adjacent tracks and improve the resolution of the sensor 902. If desired, hard bias 1002 may be located at the back edge of the sensor stack 902 to help establish an equilibrium AP configuration of magnetic layers. Some small field from the side shields SS1 906 and SS2 908 or a canting of the back edge hard bias 1002 may be used as an equivalent of the small anisotropy discussed in U.S. Patent Appl. Pub. No. 2011/0007431, which could help decrease oscillator phase noise. Side shields are also compatible with a scissor sensor design; however, the STO sensor may be less sensitive to thermal fluctuations as it is not magnoise or spin torque noise limited, only phase noise limited.

According to one embodiment, referring to FIG. 9B, a magnetic head may comprise a first shield 912, a STO sensor 902 positioned above the first shield 912, the STO sensor 902 comprising a reference layer 903 and a free layer 901 positioned above the reference layer 903, and at least one shield 906, 908, and/or 910 positioned in a plane parallel with a media-facing surface of the STO sensor 902 and transversing the STO sensor 902. The at least one shield 906, 908, and/or 910 comprises a highly magnetically permeable material that is exchange decoupled and electrically decoupled from the STO sensor 902. Any highly magnetically permeable material may be used, such as Ni, NiFe, Co, and their alloys; CoZr, CoTa, CoNb, CoFe, and their alloys, Ferrites such as Fe ferrite, Co Ferrite, Ni Ferrite, and their composites, and/or any other magnetically soft materials whose anisotropy field Hk satisfies the condition 5 Oe<Hk=Ms/K<500 Oe, where Ms is the saturation magnetization >0.1 emu/cc and K is the magnetic anisotropy energy density.

In various further embodiments, the at least one shield may comprise a side shield 906 or 908 positioned on one side of the STO sensor 902 in a cross-track direction relative to the STO sensor 902, the side shield 906 or 908 comprising a highly magnetically permeable material that is exchange decoupled and electrically decoupled from the STO sensor 902. In another embodiment, the at least one shield may comprise two side shields 906 and 908 positioned on opposite sides of the STO sensor 902 in a cross-track direction, one or both side shield 906 and 908 comprising a highly magnetically permeable material that is exchange decoupled and electrically decoupled from the STO sensor 902. According to a further embodiment, the at least one shield may comprise a second shield 910 positioned above the STO sensor 902, and possibly the two side shields 906, 908, the second shield 910 comprising a highly magnetically permeable material that is exchange decoupled and electrically decoupled from the STO sensor 902. Any arrangement of side shields and second shield may be employed that comprise the same or different highly permeable magnetic material that is exchange decoupled and electrically decoupled from the STO sensor 902.

According to one embodiment, as shown in FIG. 9B, the at least one shield may comprise a single layer of a highly magnetically permeable material 910. In another embodiment, as shown in FIG. 9C, the at least one shield may comprise a multilayer structure having two or more layers of highly magnetically permeable material 914 and one or more antiparallel coupling spacer layers 916 positioned therebetween, wherein each of the layers of highly magnetically permeable material 914 are substantially antiparallel coupled across the one or more antiparallel coupling spacer layers 916. According to yet another embodiment, with reference to FIG. 9D, the magnetic head may comprise an antiferromagnet 918, wherein the highly magnetically permeable material of the at least one side shield 914 is exchange pinned to the antiferromagnet 918. Of course, although these structures are shown above the STO sensor 902 in the position of the second shield 910, they may be positioned on one or more sides of the STO sensor 902 in positions of one or both of the side shields 906 and 908.

Accordingly, the at least one shield is configured to reduce any magnetic fields emanating from magnetic field sources offset from the STO sensor 902 in a cross-track direction. Furthermore, a magnetization of the at least one shield may provide a magnetic bias to the STO sensor 902.

According to another embodiment, as shown in FIG. 10B, the magnetic head may comprise a hard bias material 1002 positioned behind a side of the STO sensor 902 that is opposite the media-facing surface 1008 of the STO sensor 902. As shown in FIGS. 10A-10B, in this embodiment, a hard bias magnetization 1004 of the hard bias material 1002 may be canted at an angle with respect to the media-facing surface 1008 of the STO sensor 902 (cant is not shown because it is in a plane extending into the page) to provide a stabilizing transverse field and a longitudinal bias to cant a magnetization of the free layer 901 with respect to a magnetization 905 of the reference layer 903. In other embodiments, the hard bias magnetization 1004 of the hard bias material 1002 may be in a direction transverse to the media-facing surface of the STO sensor stack 902 to provide a stabilizing transverse field.

According to various embodiments, the STO sensor 902 may comprise any of two substantially antiparallel coupled oscillating layers (as described in FIG. 6 according to one embodiment), a three terminal STO sensor structure (as described in FIG. 7 according to one embodiment), and/or a thermagnonic STO sensor structure (as described in FIG. 8 according to one embodiment).

Referring again to FIG. 9D, in another embodiment, the STO sensor 902 may comprise a STO spacer layer 907 positioned between the free layer 901 and the reference layer 903, the STO spacer layer 907 comprising at least one of: a metallic layer, an insulating layer configured to conduct some amount of electricity, and/or an insulating layer comprising one or more metallic conducting channels therethrough.

In some approaches, a magnetic head comprising a STO sensor structure 900 as shown in FIGS. 9A-90D, and/or STO sensor structure 1000 as shown in FIGS. 10A-10B may be used in a magnetic data storage system. The magnetic data storage system may be similar to that shown in FIG. 1. For example, the magnetic data storage system 100 may comprise at least one magnetic head 121 as described according to any embodiment herein, a magnetic medium 112, a drive mechanism 118 for passing the magnetic medium 112 over the at least one magnetic head 121, and a controller 129 electrically coupled to the at least one magnetic head 121 for controlling operation of the at least one magnetic head 121.

Figure 11:
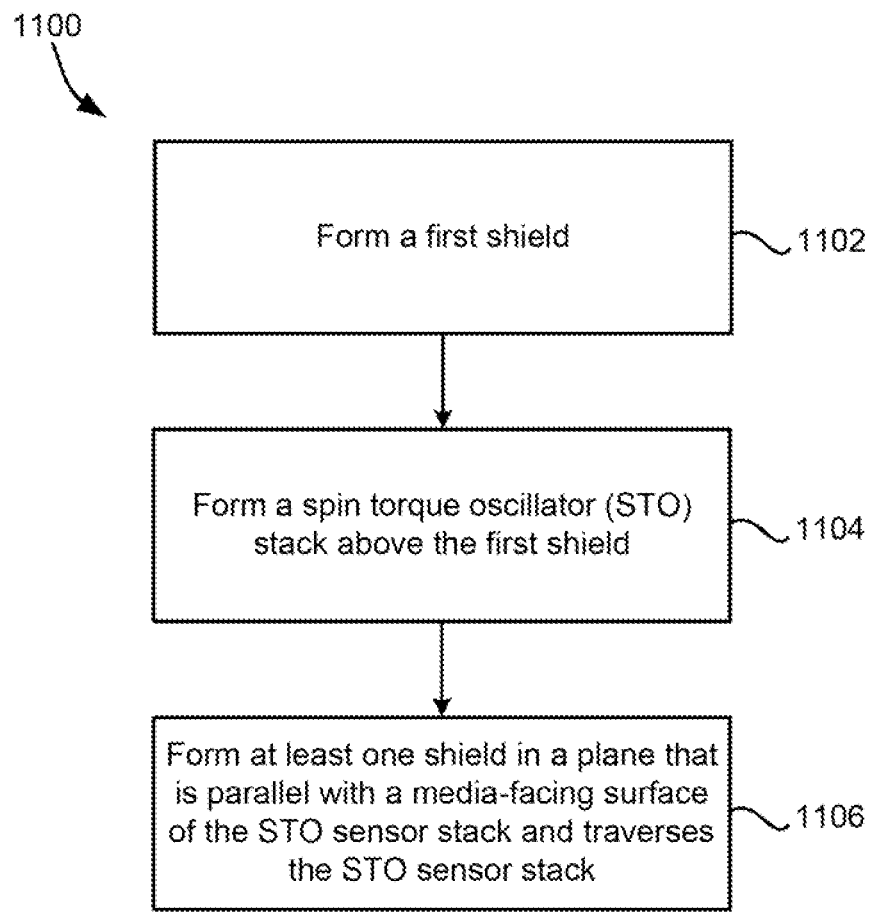
FIG. 11 is a flowchart of a method, according to one embodiment.

FIG. 11 shows a method 1100 for forming a magnetic head in accordance with one embodiment. As an option, the present method 1100 may be implemented to construct structures such as those shown in FIGS. 1-10B. Of course, however, this method 1100 and others presented herein may be used to form magnetic structures for a wide variety of devices and/or purposes which may or may not be related to magnetic recording. Further, the methods presented herein may be carried out in any desired environment. It should also be noted that any aforementioned features may be used in any of the embodiments described in accordance with the various methods.

In operation 1102, a first shield is formed. The first shield may comprise any suitable material known in the art, such as magnetic material, highly magnetically permeable material, conductive material, Co, Ni, Fe, combinations thereof, etc. Any conventional technique may be used to form the first shield, such as plating, atomic layer deposition (ALD), sputtering, etc.

In one embodiment, the highly magnetically permeable material may be chosen from a group consisting of: Ni, NiFe, Co, and their alloys; CoZr, CoTa, CoNb, CoFe, and their alloys; Fe ferrite, Co Ferrite, Ni Ferrite, and their composites; and magnetically soft materials whose anisotropy field Hk satisfies a condition of 5 Oe<Hk=Ms/K<500 Oe, where Ms is saturation magnetization >0.1 emu/cc and K is magnetic anisotropy energy density.

In operation 1104, a STO stack is formed above the first shield. The STO stack comprises at least a reference layer and a free layer positioned above the reference layer, as known in the art. Some additional layers may also be formed, such as underlayer(s) and/or cap layer(s). The materials of the STO sensor stack may include any suitable materials as known in the art.

In one embodiment, the STO sensor stack may be formed directly on the first shield, or may have one or more layers formed therebetween.

In operation 1106, at least one shield is formed in a plane that is parallel with a media-facing surface of the STO sensor stack, the plane also intersecting the sensor stack. What is meant by this is that the plane in which the at least one shield is formed is parallel with the ABS, and may lie on the ABS, or is away from the ABS but still at a position that is capable of intersecting the sensor stack, e.g., the plane is not positioned above the sensor stack in a element height direction. In one embodiment, a side shield is formed on one side of the STO sensor stack via an insulating layer. In another embodiment, side shields are formed on opposite sides of the STO sensor stack in the cross-track direction. In even another embodiment, a second shield may be formed above the STO sensor stack, with or without the one or more side shields.

The at least one shield may be formed using any conventional technique, such as plating, ALD, sputtering, etc., and may comprise any suitable material known in the art, such as magnetic material, highly magnetically permeable material, conductive material, Co, Ni, Fe, combinations thereof, etc. In one embodiment, the at least one shield comprises a highly magnetically permeable material that is exchange decoupled and electrically decoupled from the STO sensor stack.

In a further embodiment, the method 1100 may further comprise forming an insulating layer above the first shield and on sides of the STO sensor stack between the STO sensor stack and the at least one shield.

In another embodiment, the at least one shield comprises either: a single layer of a highly magnetically permeable material, or a multilayer structure having two or more layers of highly magnetically permeable material and one or more antiparallel coupling spacer layers positioned therebetween, wherein each of the layers of highly magnetically permeable material are substantially antiparallel coupled across the one or more antiparallel coupling spacer layers.

In another approach, the method 1100 may further comprise forming an antiferromagnet behind the STO sensor stack and/or on sides of the sensor stack. The highly magnetically permeable material of the at least one side shield is exchange pinned to the antiferromagnet in this embodiment.

In yet another approach, the method 1100 may further comprise forming a hard bias material positioned behind a side of the STO sensor stack opposite the media-facing surface of the STO sensor stack. A hard bias magnetization of the hard bias material may be in a direction transverse to the media-facing surface of the STO sensor stack to provide a stabilizing transverse field, or in an alternate embodiment, the hard bias magnetization of the hard bias material may be canted at an angle with respect to the media-facing surface of the STO sensor stack to provide a stabilizing transverse field and a longitudinal bias to cant a magnetization of the free layer with respect to a magnetization of the reference layer.

In another approach, the STO sensor stack may further comprise a STO spacer layer positioned between the free layer and the reference layer, the STO spacer layer comprising at least one of: a metallic layer, an insulating layer configured to conduct some amount of electricity, and an insulating layer comprising one or more metallic conducting channels therethrough.

It is beneficial to use one of the sensor configurations described herein according to any of the embodiments, which are more flexible in terms of hard bias placement, to simplify manufacturing while still maintaining the benefit of increased SNR and a larger physical track width.

It should be noted that methodology presented herein for at least some of the various embodiments may be implemented, in whole or in part, in computer hardware, software, by hand, using specialty equipment, etc. and combinations thereof.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic head, comprising:
a first shield;
a spin torque oscillator (STO) sensor positioned above the first shield, the STO sensor comprising a reference layer and a free layer positioned above the reference layer;
a second shield positioned above the STO sensor; and
at least one side shield having a portion thereof positioned in a plane of deposition of the free layer,
wherein one or more of the at least one side shield comprises a highly magnetically permeable material that is exchange decoupled and electrically decoupled from the STO sensor,
wherein the second shield is directly exchange coupled with the at least one side shield,
wherein a magnetization of the at least one side shield provides a magnetic bias to the STO sensor, and
wherein the STO sensor comprises at least one of: two substantially antiparallel coupled oscillating layers, a three terminal STO sensor structure, and a thermagnonic STO sensor structure.

2. The magnetic head as recited in claim 1, wherein the at least one side shield is positioned on only one side of the STO sensor in a cross-track direction relative to the STO sensor and comprises the highly magnetically permeable material that is exchange decoupled and electrically decoupled from the STO sensor.

3. The magnetic head as recited in claim 1, wherein the at least one side shield comprises two side shields positioned on opposite sides of the STO sensor in a cross-track direction, each side shield comprising the highly magnetically permeable material that is exchange decoupled and electrically decoupled from the STO sensor.

4. The magnetic head as recited in claim 1, wherein the second shield comprises a highly magnetically permeable material that is different from the highly magnetically permeable material of the one or more of the at least one side shield.

5. The magnetic head as recited in claim 1, wherein an interface is positioned between the at least one side shield and the second shield.

6. The magnetic head as recited in claim 1, wherein the at least one side shield and/or the second shield comprises a single layer of a highly magnetically permeable material, the highly magnetically permeable material being chosen from a group consisting of: Ni, NiFe, Co, and their alloys; CoZr, CoTa, CoNb, CoFe, and their alloys; Fe ferrite, Co Ferrite, Ni Ferrite, and their composites; and magnetically soft materials whose anisotropy field Hk satisfies a condition of 5 Oe<Hk=Ms/K<500 Oe, where Ms is saturation magnetization >0.1 emu/cc and K is magnetic anisotropy energy density.

7. The magnetic head as recited in claim 1, wherein the at least one side shield and/or the second shield comprises a multilayer structure having two or more layers of highly magnetically permeable material and one or more antiparallel coupling spacer layers positioned therebetween, wherein each of the layers of highly magnetically permeable material is substantially antiparallel coupled across the one or more antiparallel coupling spacer layers.

8. The magnetic head as recited in claim 1, further comprising an antiferromagnet, wherein the highly magnetically permeable material of the at least one side shield is exchange pinned to the antiferromagnet.

9. The magnetic head as recited in claim 1, wherein the at least one side shield is configured to reduce any magnetic fields emanating from magnetic field sources which are offset from the STO sensor in a cross-track direction.

10. The magnetic head as recited in claim 1, further comprising a hard bias material positioned behind a side of the STO sensor opposite a media-facing surface of the STO sensor.

11. The magnetic head as recited in claim 10, wherein a hard bias magnetization of the hard bias material is in a direction transverse to the media-facing surface of the STO sensor to provide a stabilizing transverse field.

12. The magnetic head as recited in claim 11, wherein a hard bias magnetization of the hard bias material is canted at an angle with respect to the media-facing surface of the STO sensor to provide a stabilizing transverse field and a longitudinal bias to cant a magnetization of the free layer with respect to a magnetization of the reference layer.

13. The magnetic head as recited in claim 1, wherein the STO sensor comprises a STO spacer layer positioned between the free layer and the reference layer, the STO spacer layer comprising at least one of: a metallic layer, an insulating layer configured to conduct some amount of electricity, and an insulating layer comprising one or more metallic conducting channels therethrough.

14. A magnetic data storage system, comprising:
at least one magnetic head as recited in claim 1;
a magnetic medium;
a drive mechanism for passing the magnetic medium over the at least one magnetic head; and
a controller electrically coupled to the at least one magnetic head for controlling operation of the at least one magnetic head.

15. A method for forming a magnetic head, the method comprising:
forming a first shield;
forming a spin torque oscillator (STO) sensor stack above the first shield, the STO sensor stack comprising a reference layer positioned below a free layer;
forming a second shield above the STO sensor stack; and
forming at least one side shield having a portion thereof in a plane of deposition of the free layer,
wherein one or more of the at least one side shield comprises a highly magnetically permeable material that is exchange decoupled and electrically decoupled from the STO sensor stack,
wherein the second shield is directly exchange coupled with the at least one side shield,
wherein a magnetization of the at least one side shield provides a magnetic bias to the STO sensor, and
wherein the STO sensor comprises at least one of: two substantially antiparallel coupled oscillating layers, a three terminal STO sensor structure, and a thermagnonic STO sensor structure.

16. The method as recited in claim 15, further comprising forming an insulating layer above the first shield and on sides of the STO sensor stack between the STO sensor stack and the at least one side shield.

17. The method as recited in claim 16, wherein the at least one side shield comprises two side shields positioned on opposite sides of the STO sensor stack in a cross-track direction, each side shield comprising the highly magnetically permeable material that is exchange decoupled and electrically decoupled from the STO sensor stack.

18. The method as recited in claim 17, wherein the second shield comprises a highly magnetically permeable material that is different from the highly magnetically permeable material of the one or more of the at least one side shield.

19. The method as recited in claim 17, wherein the at least one side shield and/or the second shield comprises either: a single layer of the highly magnetically permeable material, or a multilayer structure having two or more layers of highly magnetically permeable material and one or more antiparallel coupling spacer layers positioned therebetween, wherein each of the layers of the highly magnetically permeable material is substantially antiparallel coupled across the one or more antiparallel coupling spacer layers, and wherein the highly magnetically permeable material is chosen from a group consisting of: Ni, NiFe, Co, and their alloys; CoZr, CoTa, CoNb, CoFe, and their alloys; Fe ferrite, Co Ferrite, Ni Ferrite, and their composites; and magnetically soft materials whose anisotropy field Hk satisfies a condition of 5 Oe<Hk=Ms/K<500 Oe, where Ms is saturation magnetization >0.1 emu/cc and K is magnetic anisotropy energy density.

20. The method as recited in claim 18, further comprising forming an antiferromagnet, wherein the highly magnetically permeable material of the at least one side shield is exchange pinned to the antiferromagnet.

21. The method as recited in claim 15, further comprising forming a hard bias material positioned behind a side of the STO sensor stack opposite a media-facing surface of the STO sensor stack.

22. The method as recited in claim 21, wherein a hard bias magnetization of the hard bias material is in a direction transverse to the media-facing surface of the STO sensor stack to provide a stabilizing transverse field.

23. The method as recited in claim 22, wherein a hard bias magnetization of the hard bias material is canted at an angle with respect to the media-facing surface of the STO sensor stack to provide a stabilizing transverse field and a longitudinal bias to cant a magnetization of the free layer with respect to a magnetization of the reference layer.

24. The method as recited in claim 19, wherein the STO sensor stack further comprises a STO spacer layer positioned between the free layer and the reference layer, the STO spacer layer comprising at least one of: a metallic layer, an insulating layer configured to conduct some amount of electricity, and an insulating layer comprising one or more metallic conducting channels therethrough.

* * * * *

UNITED STATES PATENT AND TRADEMARK OFFICE
CERTIFICATE OF CORRECTION

PATENT NO. : 8,902,544 B2  
APPLICATION NO. : 13/714322  
DATED : December 2, 2014  
INVENTOR(S) : Patrick M. Braganca et al.

Page 1 of 1

It is certified that error appears in the above-identified patent and that said Letters Patent is hereby corrected as shown below:

In the specification:

col. 7, line 31 replace "TO)," with --T0),--;

col. 7, line 32 replace "TI," with --T1,--;

col. 7, line 56 replace "tHk" with --Hk--;

col. 11, line 20 replace "9A-90D," with --9A-9D,--.

Signed and Sealed this  
Seventh Day of July, 2015

Michelle K. Lee  
*Director of the United States Patent and Trademark Office*